(12) United States Patent
Jung et al.

(10) Patent No.: US 11,107,541 B2
(45) Date of Patent: Aug. 31, 2021

(54) MEMORY DEVICE AND METHOD OF OPERATING THE MEMORY DEVICE

(71) Applicant: SK hynix Inc., Icheon-si (KR)

(72) Inventors: Young Don Jung, Suwon-si (KR); Jung Mi Ko, Icheon-si (KR); Kwang Ho Baek, Icheon-si (KR); Chang Han Son, Seoul (KR); Jung Hwan Lee, Osan-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/931,276

(22) Filed: May 13, 2020

(65) Prior Publication Data

US 2021/0166771 A1   Jun. 3, 2021

(30) Foreign Application Priority Data

Nov. 29, 2019   (KR) .......................... 10-2019-0157530

(51) Int. Cl.
| | |
|---|---|
| *G11C 16/34* | (2006.01) |
| *G11C 16/04* | (2006.01) |
| *G11C 16/10* | (2006.01) |
| *G11C 16/24* | (2006.01) |
| *G11C 11/56* | (2006.01) |
| *G11C 16/26* | (2006.01) |

(52) U.S. Cl.
CPC ...... *G11C 16/3459* (2013.01); *G11C 16/0483* (2013.01); *G11C 16/10* (2013.01); *G11C 16/24* (2013.01); *G11C 11/5621* (2013.01); *G11C 11/5671* (2013.01); *G11C 16/26* (2013.01)

(58) Field of Classification Search
CPC . G11C 16/3459; G11C 16/0483; G11C 16/24; G11C 16/10; G11C 11/5671; G11C 11/5621; G11C 16/26
See application file for complete search history.

(56) References Cited

U.S. PATENT DOCUMENTS

| | | | |
|---|---|---|---|
| 9,449,694 B2* | 9/2016 | Paudel | ................ G11C 11/5628 |
| 10,379,689 B2* | 8/2019 | Miyazaki | .............. G06F 3/0443 |
| 2010/0195397 A1* | 8/2010 | Hemink | ............ G11C 16/0483 365/185.17 |
| 2019/0295669 A1* | 9/2019 | Yang | ..................... G11C 16/08 |

FOREIGN PATENT DOCUMENTS

| | | | |
|---|---|---|---|
| KR | 1020150001134 A | | 1/2015 |
| KR | 101716713 B1 | | 3/2017 |

\* cited by examiner

*Primary Examiner* — Gene N Auduong
(74) *Attorney, Agent, or Firm* — William Park & Associates Ltd.

(57) ABSTRACT

The present technology relates to a memory device and method of operating the memory device. The memory device includes a plurality of memory cells, a peripheral circuit, and control logic. The peripheral circuit performs a plurality of program loops each including a program operation and a verify operation on selected memory cells of the plurality of memory cells. The control logic controls the peripheral circuit to increase a potential of selected bit lines.

33 Claims, 13 Drawing Sheets

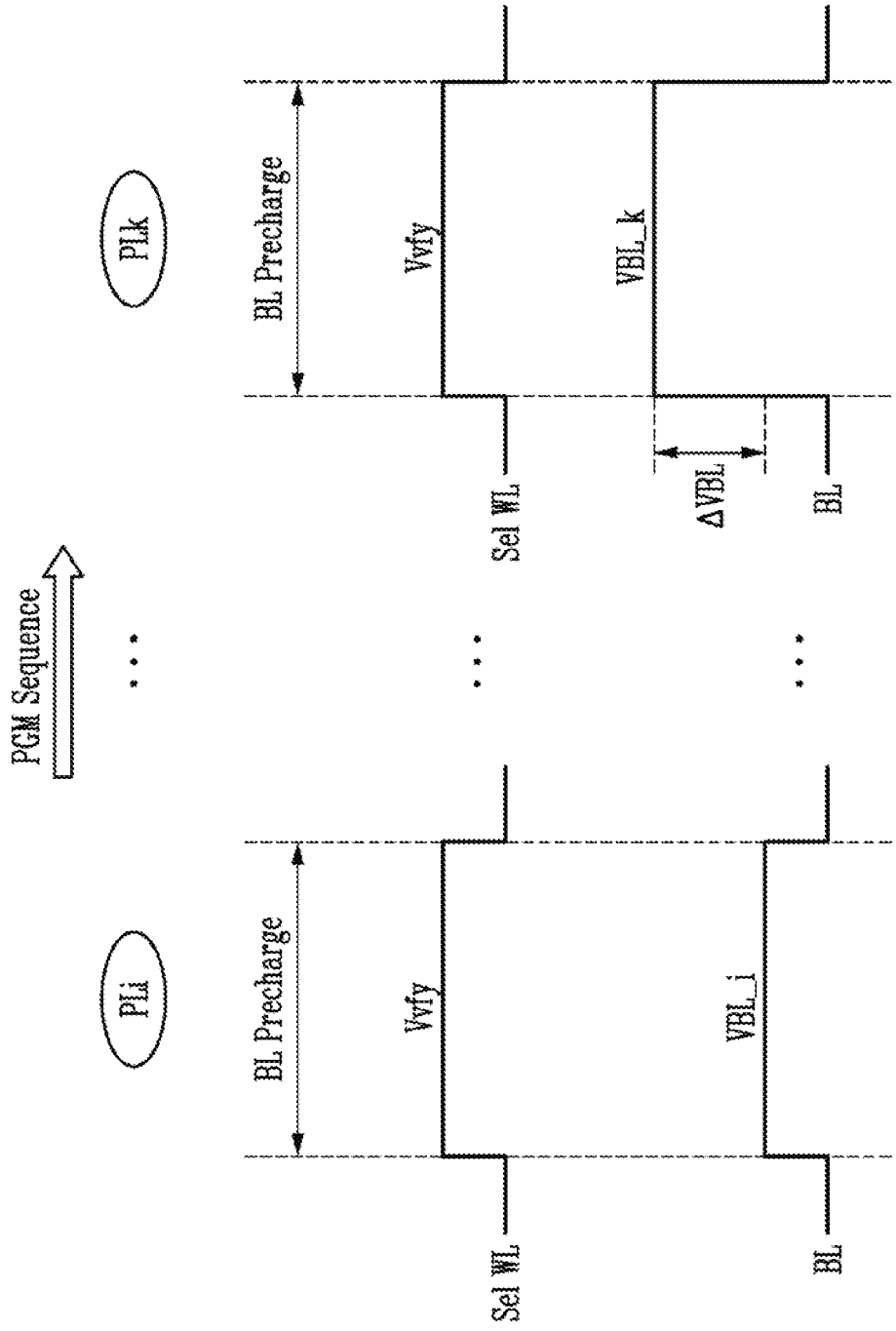

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2019-0157530 filed on Nov. 29, 2019, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even though power is cut off. The non-volatile memory device include a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure includes a plurality of memory cells, a peripheral circuit, and control logic. The peripheral circuit performs a plurality of program loops each including a program operation and a verify operation on selected memory cells of the plurality of memory cells. The control logic controls the peripheral circuit to increase a potential of selected bit lines among bit lines connected to the selected memory cells to a reference voltage level during a first period and increase the potential of the selected bit lines to a final voltage level during a second period. The reference voltage level is determined differently according to a program loop count indicating the number of program loops that have been successively performed.

A memory device according to an embodiment of the present disclosure includes a plurality of memory cells, a peripheral circuit, and control logic. The peripheral circuit perform a plurality of program loops each including a program operation and a verify operation on selected memory cells of the plurality of memory cells. The control logic controls the peripheral circuit to increase a potential of the bit lines connected to the selected memory cells to a target voltage level, in the verify operation. The target voltage level is determined differently according to a program loop count indicating the number of program loops that have been successively performed.

In a method of operating a memory device that performs a plurality of program loops each including a program step and a verify step for selected memory cells of a plurality of memory cells, the program step includes increasing a potential of selected bit lines among bit lines connected to the selected memory cells to a reference voltage level, and increasing the potential of the selected bit lines from the reference voltage level to a final voltage level. The reference voltage level is determined differently according to a program loop count indicating the number of program loops that have been successively performed.

In a method of operating a memory device that performs a plurality of program loops each including a program step and a verify step for selected memory cells of a plurality of memory cells, the verify step includes applying a verify voltage to a word line connected to the selected memory cells, and increasing a potential of bit lines connected to the selected memory cells to a target voltage level. The target voltage level is determined differently according to a program loop count indicating the number of program loops that have been successively performed.

BRIEF DESCRIPTION OF THE DRAWINGS

FIG. 9A is a diagram for describing a bit line precharge period according to an embodiment.

DETAILED DESCRIPTION

Hereinafter, the present disclosure will be described by describing a preferred embodiment of the present disclosure with reference to the accompanying drawings. Hereinafter, an embodiment of the present disclosure will be described with reference to the accompanying drawings.

An embodiment of the present disclosure may provide a memory device having improved program performance and a method of operating the memory device.

Figure 1:
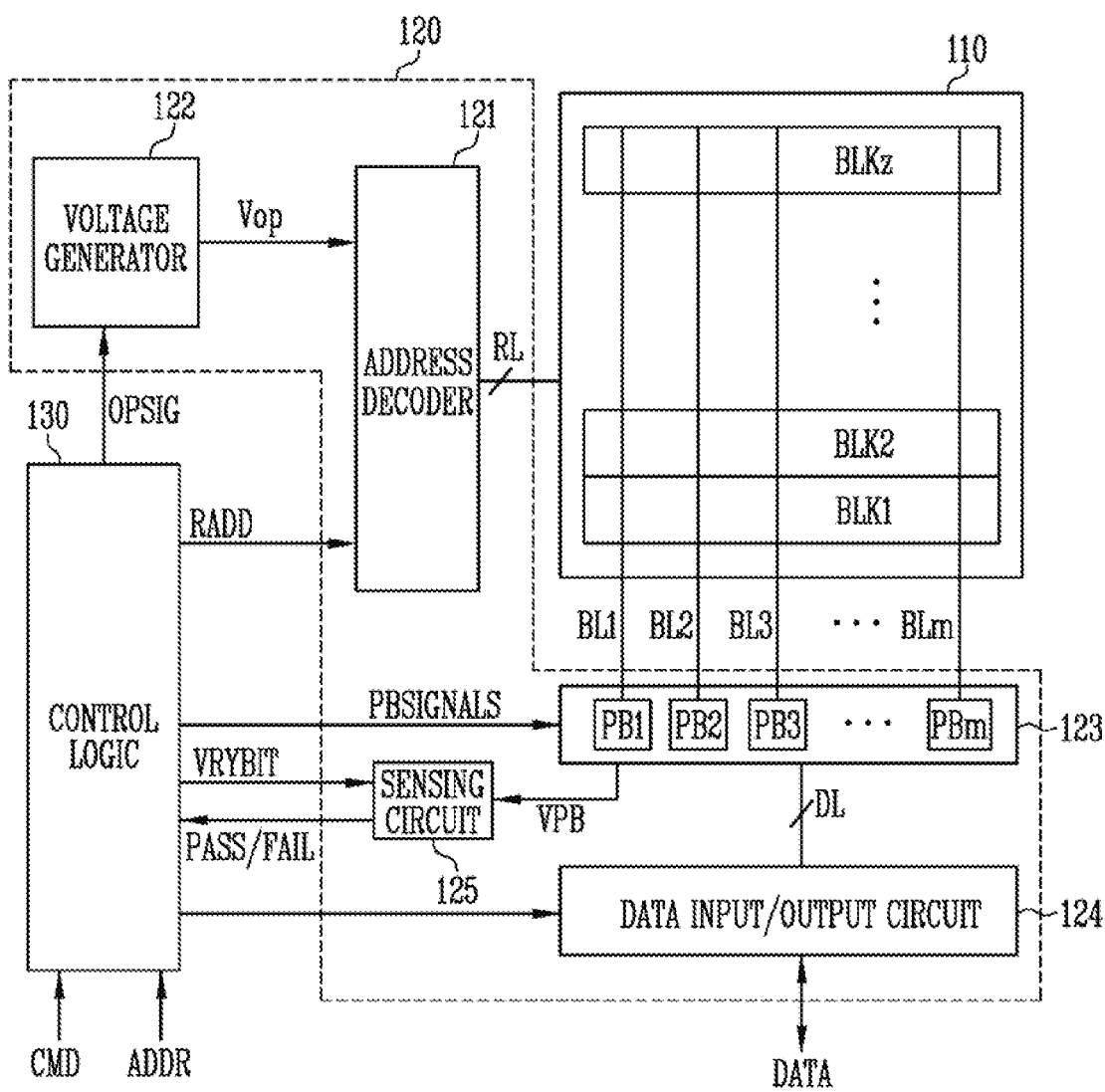
FIG. 1 is a diagram for describing a structure of a memory device according to an embodiment of the present disclosure.

FIG. 1 is a diagram for describing a structure of a memory device according to an embodiment of the present disclosure.

Referring to FIG. 1, a memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives a row address RADD from the control logic 130.

The address decoder 121 is configured to decode a block address of the row address RADD. The address decoder 121 selects at least one memory block among the memory blocks BLK1 to BLKz according to the decoded block address. The address decoder 121 may select at least one word line of a selected memory block by applying voltages supplied from the voltage generator 122 to at least one word line WL according to the decoded row address RADD.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal power voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

In an embodiment, the control logic 130 may control the peripheral circuit 120 to perform a plurality of program loops each including a program operation and a verify operation on selected memory cells among the plurality of memory cells.

Specifically, the control logic 130 may control the voltage generator 122 through the operation signal OPSIG to generate a voltage related to the program operation and the verify operation. The control logic 130 may control the address decoder 121 through the row address RADD to select a word line on which the program operation and the verify operation are to be performed. The control logic 130 may control the read and write circuit 123 through the read and write circuit control signal PBSIGNALS to control a voltage of the bit lines connected to the selected memory cells. The control logic 130 may control the data input/output circuit 124 to input program data to the selected memory cells. The control logic 130 may determine whether the verify operation is passed or failed in response to the pass or fail signal PASS/FAIL output by the sensing circuit 125.

In an embodiment, in the program operation, the control logic 130 may control the peripheral circuit 120 to increase a potential of the selected bit lines among the bit lines connected to the selected memory cells to a reference voltage level during a first period and increase the potential of the selected bit lines to a final voltage level during a second period. The selected bit lines may be bit lines connected to a program inhibition cell among the selected memory cells. The final voltage level may be a program inhibition voltage level. The control logic 130 may determine the reference voltage level differently according to a program loop count. This will be described with reference to FIGS. 7 and 8.

In an embodiment, in the verify operation, the control logic 130 controls the peripheral circuit 120 to increase the potential of the bit lines connected to the selected memory cells to a target voltage level. The control logic 130 may determine the target voltage level differently according to the program loop count.

Figure 2:
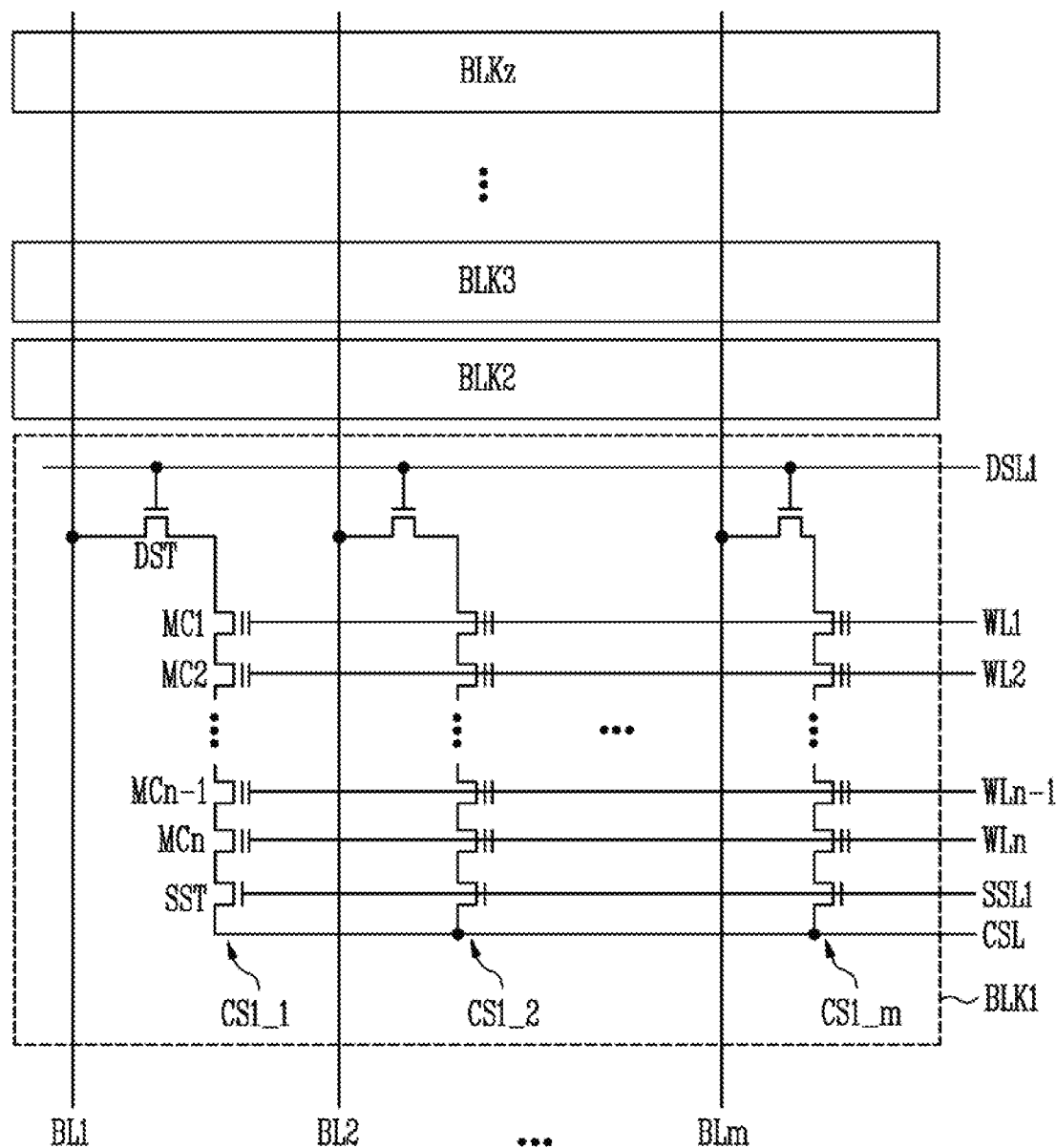
FIG. 2 is a diagram for describing a memory cell array of FIG. 1.

FIG. 2 is a diagram for describing the memory cell array of FIG. 1.

Referring to FIG. 2, the first to z-th memory blocks BLK1 to BLKz are commonly connected to the first to m-th bit lines BL1 to BLm. In FIG. 2, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The first memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn connected in series (n is a positive integer), and a source select transistor SST.

Gate terminals of the drain select transistors DST included in each of the first to m-th cell strings CS1_1 to CS1_m are connected to a drain select line DSL1. Gate terminals of the first to n-th memory cells MC1 to MCn included in each of the first to m-th cell strings CS1_1 to CS1_m are connected to the first to n-th word lines WL1 to WLn, respectively. Gate terminals of the source select transistors SST included in each of the first to m-th cell strings CS1_1 to CS1_m are connected to a source select line SSL1.

For convenience of description, a structure of the cell string will be described with reference to the first cell string CS1_1 of the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 1. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 3:
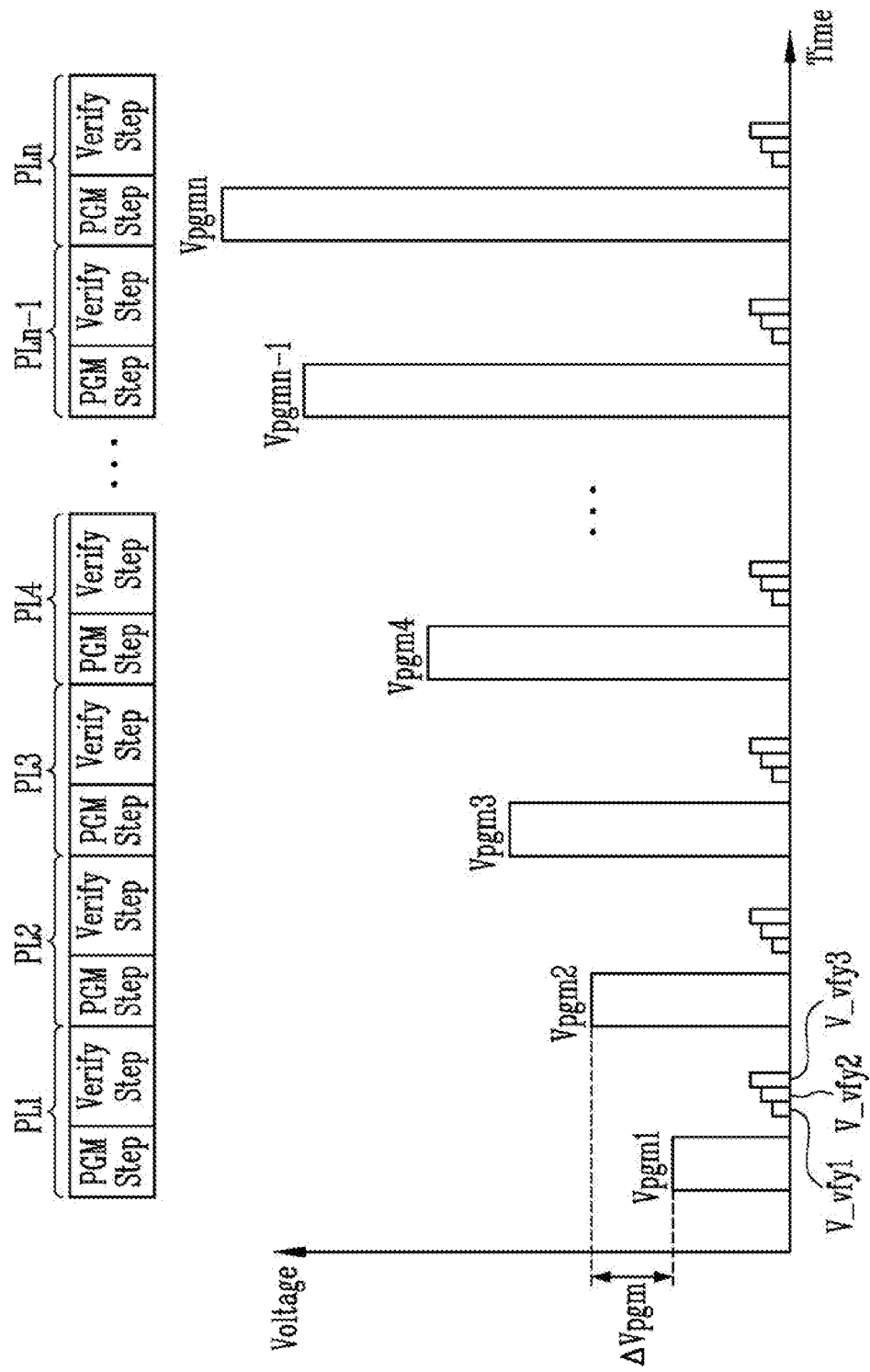
FIG. 3 is a diagram for describing a program operation according to an embodiment.

FIG. 3 is a diagram for describing the program operation according to an embodiment.

In FIG. 3, for convenience of description, it is assumed that each of the plurality of memory cells is a multi-level cell (MLC) that stores 2-bit data. However, the scope of the present disclosure is not limited thereto, and each of the plurality of memory cells may be a triple level cell (TLC) that stores 3-bit data or a quad-level cell (QLC) that stores 4-bit data.

The program operation of the memory device may include a plurality of program loops PL1 to PLn. That is, the memory device may perform the plurality of program loops PL1 to PLn so that the selected memory cells have a threshold voltage corresponding to any one of a plurality of program states P1, P2, and P3.

Each of the plurality of program loops PL1 to PLn may include a program step PGM Step of applying a program voltage to a selected word line connected to the selected memory cells, and a verity step Verify Step of determining whether the memory cells are programmed by applying verify voltages.

For example, when a first program loop PL1 is performed, first to third verify voltages V_vfy1 to V_vfy3 are sequentially applied to verify the program state of the plurality of memory cells after a first program pulse Vpgm1 is applied. At this time, the memory cells of which a target program state is a first program state P1 may be verified by a first verify voltage V_vfy1, the memory cells of which a target program state is a second program state P2 may be verified by a second verify voltage V_vfy2, and the memory cells of which a target program state is a third program state P3 may be verified by a third verify voltage V_vfy3.

The memory cells of which the verification is passed by the respective verify voltages V_vfy1 to V_vfy3 may be determined to have the target program state, and then program inhibited in the second program loop PL2. In the program inhibited memory cells, a program inhibition voltage may be applied to the bit line connected to the memory cells. The program inhibition voltage may be a power voltage. A second program pulse Vpgm2 higher than the first program pulse Vpgm1 by a unit voltage ΔVpgm is applied to the selected word line so as to program the remaining memory cells that are not programmed to the target program state. Thereafter, the verify operation is performed in the same manner as the verify operation of the first program loop PL1. For example, the verify pass indicates that the memory cell is read as an off-cell by a corresponding verify voltage.

As described above, when the memory device programs the multi-level cell (MLC) that stores 2-bits, the memory device verifies each of the memory cells of which the program state is the target program state using the first to third verify voltages V_vfy1 to V_vfy3.

During the verify operation, the verify voltage may be applied to the selected word line, which is the word line to which the selected memory cells are connected, and the page buffer of FIG. 1 may determine whether the verification of the memory cells is passed based on a current flowing through the bit lines connected to the selected memory cells, respectively, or a voltage applied to the bit lines.

In an embodiment, the program inhibition cell may be a cell in which a program is completed as the target program state among program target cells or a cell that is not a program target. When the program operation is performed on memory cells connected to even bit lines, the memory cells connected to the even bit lines may be the program target cell. Memory cells connected to odd bit lines may be cells that are not the program target.

Figure 4:
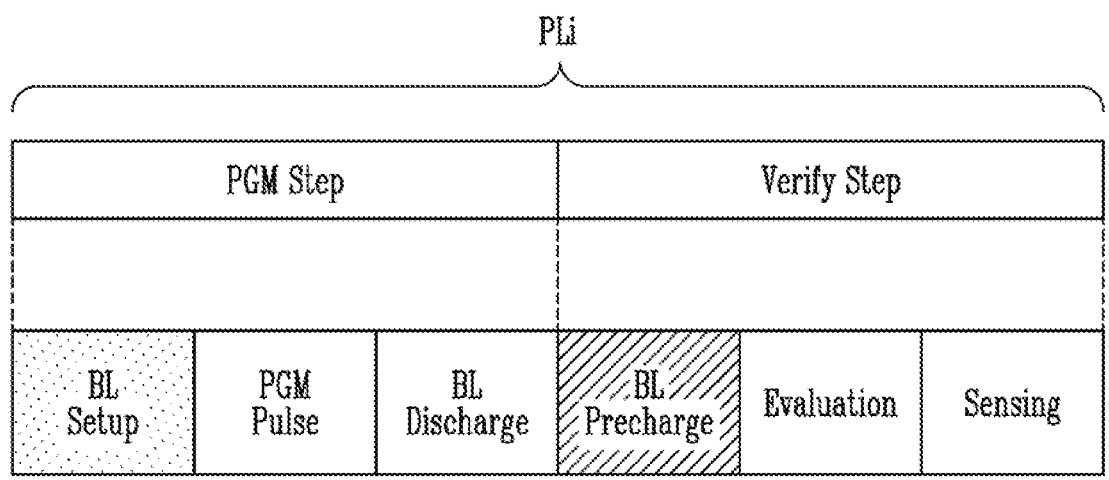
FIG. 4 is a diagram for describing a program loop of FIG. 3.

FIG. 4 is a diagram for describing the program loop of FIG. 3.

Referring to FIG. 4, the program loop PLi includes a program step PGM step and a verify step Verify Step.

The program step PGM step may include a bit line setup period BL Setup, a program pulse application period PGM Pulse, and a bit line discharge period BL Discharge.

Specifically, in the bit line setup period BL Setup, a bit line setup operation of setting up the potential of the bit line connected to the selected memory cells may be performed according to data to be stored in the selected memory cells. In the program pulse application period PGM Pulse, a program pulse application operation of applying a program pulse to the selected memory cells to program the selected memory cells to the target program state may be performed. In the bit line discharge period BL discharge, a bit line discharge operation of discharging potentials of the word line and the bit line connected to the selected memory cells to a ground voltage may be performed.

The verify step Verify Step may include a bit line precharge period BL precharge, an evaluation period Evaluation, and a sensing period Sensing. Specifically, in the bit line precharge period BL precharge, a bit line precharge operation of precharging the bit line to verify the program state of the selected memory cells may be performed. In the evaluation period Evaluation, an evaluation operation in which the potential of the bit line is discharged according to a result of comparison between the threshold voltage and the verify voltage of the selected memory cell may be performed. In the sensing period Sensing, a sensing operation of sensing data stored in the selected memory cell according to the potential of the discharged bit line may be performed.

Figure 5:
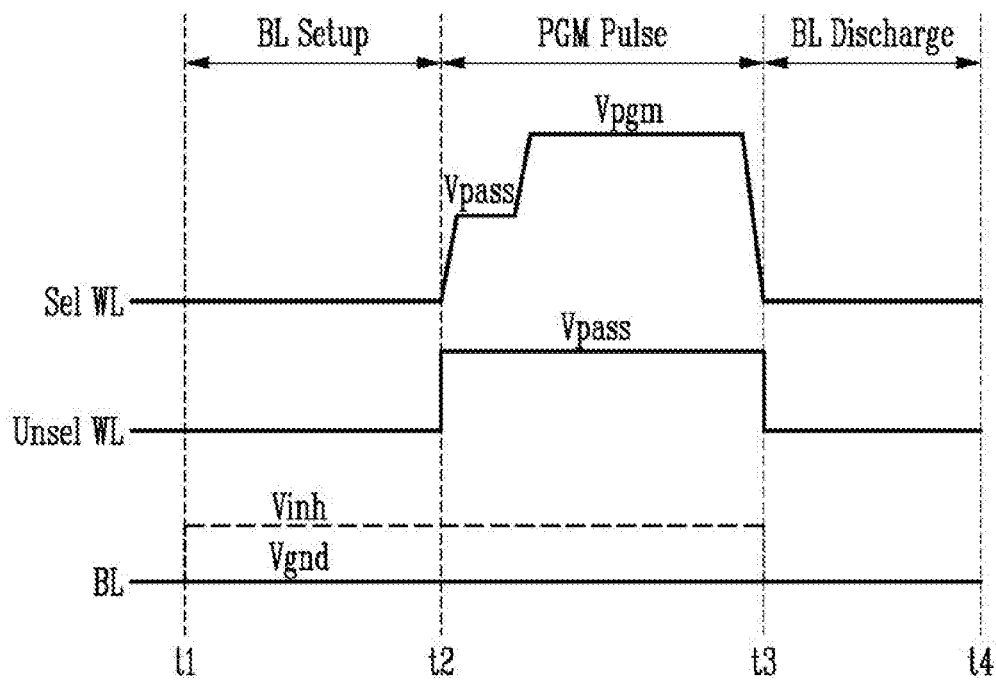
FIG. 5 is a diagram for describing a program step of FIG. 4.

FIG. 5 is a diagram for describing the program step of FIG. 4.

Referring to FIG. 5, the program step of FIG. 4 may include a bit line setup period BL Setup, a program pulse application period PGM Pulse, and a bit line discharge period BL Discharge.

t1 to t2 may be the bit line setup period BL Setup. In the bit line setup period BL Setup, a program permission voltage Vgnd may be applied to the bit line BL connected to the cell which is not programmed to the target program state among the selected memory cells. The program permission voltage may be a ground voltage. A program inhibition voltage Vinh may be applied to the bit line BL connected to the program inhibition cell among the selected memory cells. The program inhibition voltage may be a power voltage. The program inhibition cell may be the cell in which the program is completed to the target program state or the cell which is not the program target.

t2 to t3 may be the program pulse application period PGM Pulse. In the program pulse application period PGM Pulse, the program voltage Vpgm may be applied after the pass voltage Vpass is applied to the selected word line Sel WL connected to the selected memory cells. The program voltage may increase as the program loop increases according to an incremental step program pulse (ISPP) method. The pass voltage Vpass may be applied to the remaining unselected word lines except for the selected word line. After increasing potentials of the selected word line Sel WL and the unselected word line Unsel WL to the pass voltage Vpass, the potential of the selected word line Sel WL is increased to the program voltage Vpgm, thereby minimizing program disturbance due to coupling between the word lines.

The potential difference on the cells to which the program permission voltage Vgnd is applied by the bit line BL may increase to a potential difference between the program voltage and the program permission voltage, and the threshold voltage of the memory cell may increase to a threshold voltage corresponding to the target program state. The potential difference on the cells to which the program inhibition voltage Vinh is applied by the bit line BL might not increase the threshold voltage of the memory cell because the potential difference between the program inhibition voltage and the program permission voltage is small.

t3 to t4 may be the bit line discharge period BL Discharge. In the bit line discharge period BL discharge, in order to perform the verify step after the program step, a bit line discharge operation of discharging the potentials of the word line and the bit line connected to the selected memory cells to the ground voltage may be performed.

In the bit line discharge period BL discharge, the potential of the bit line BL may be discharged to the ground voltage. The potential of the selected word line Sel WL may be discharged from the program voltage Vpgm to the ground voltage. The potential of the unselected word line may be discharged from the pass voltage Vpass to the ground voltage.

Figure 6:
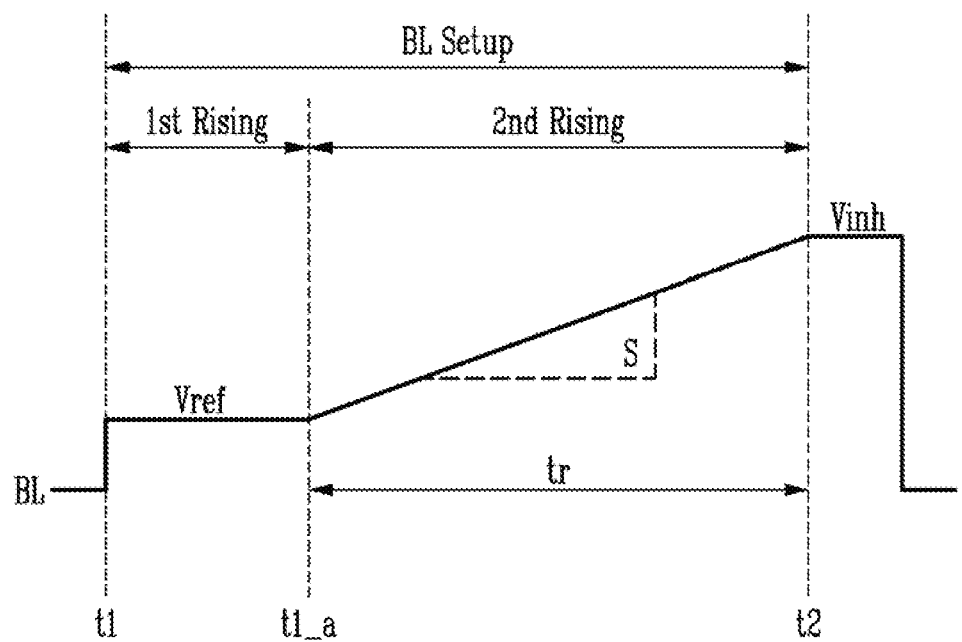
FIG. 6 is a diagram for describing a bit line setup period of FIG. 5.

FIG. 6 is a diagram for describing the bit line setup period of FIG. 5.

Referring to FIG. 6, in the bit line setup period BL Setup of FIG. 5, the program permission voltage Vgnd may be applied to the bit line connected to the cell in which the program is not completed among the selected memory cells, and the program inhibition voltage Vinh may be applied to the bit line connected to the program inhibition cell.

In FIG. 6, description will be given based on the potential of the bit line BL connected to the program inhibition cell in the bit line setup period BL Setup.

In an embodiment, the bit line setup period BL Setup may be divided into a first period and a second period.

t1 to t1_a may be the first period. In the first period, the potential of the bit line BL may increase from a ground voltage level to a reference voltage level Vref. Specifically, at t1 time point, the potential of the bit line BL may increase rapidly from the ground voltage level to the reference voltage level Vref.

t1_a to t2 may be the second period. In the second period, the potential of the bit line BL may increase from the reference voltage level Vref to a final voltage level Vinh. The final voltage level Vinh may be a program inhibition voltage. In the second period, the potential of the bit line BL may increase during a predetermined time tr at a constant slope S. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

According to an embodiment of the present disclosure, the potential of the bit line BL may increase to the reference voltage level in a short time in the first period, and may increase to the final voltage level at the constant slope in the second period. An increase time of the bit line potential may be shortened in the first period, and peak current occurrence may be prevented in the second period. That is, since the potential of the bit line BL increases in different forms in different periods, a bit line setup time may be shortened and a peak current may be prevented.

In another embodiment, the bit line setup period may be divided into at least two periods. In this case, the target level of the potential of the bit line in the last period may be the final voltage level.

Figure 7:
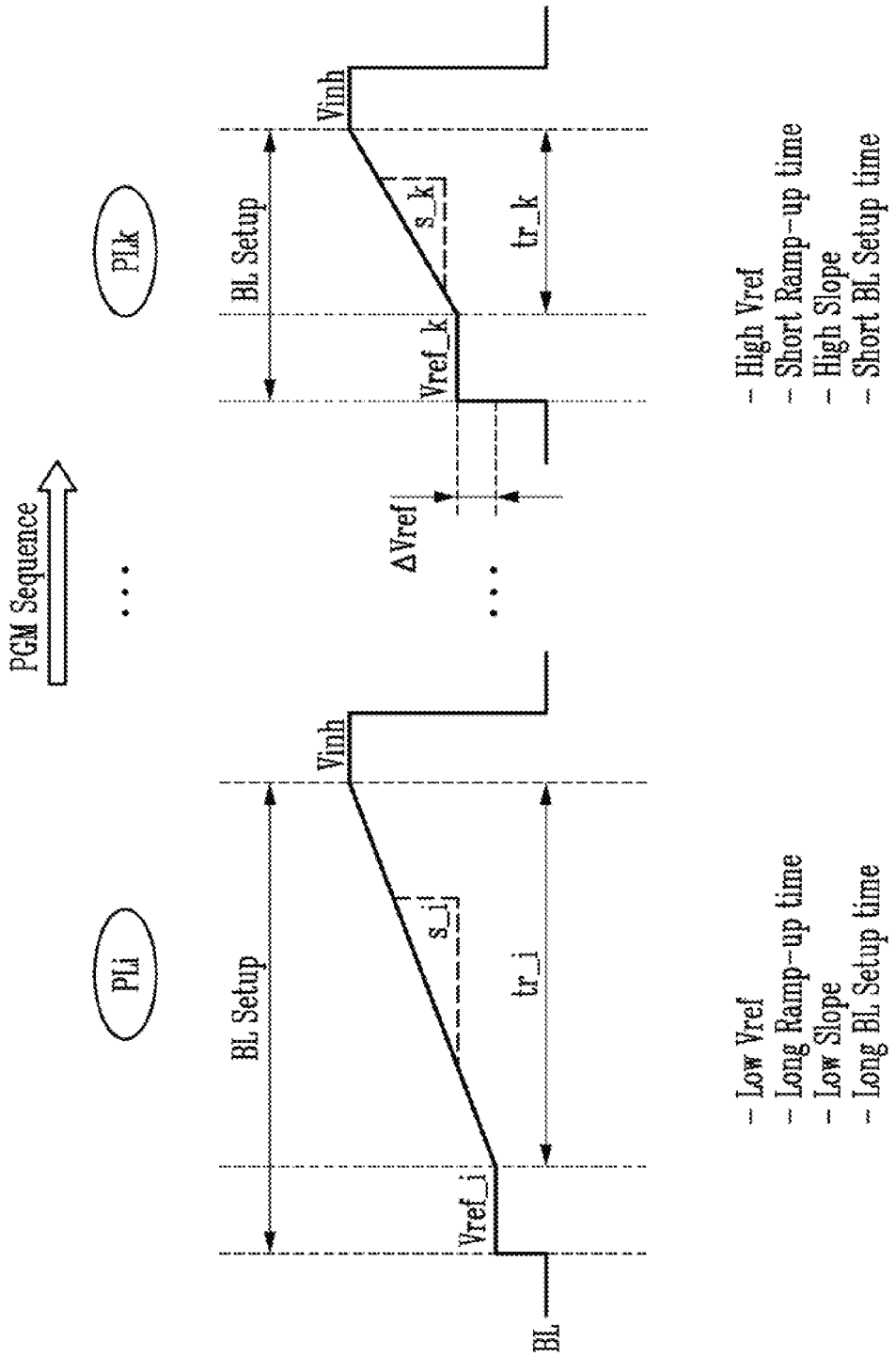
FIG. 7 is a diagram for describing the bit line setup period according to an embodiment.

FIG. 7 is a diagram for describing the bit line setup period according to an embodiment.

Referring to FIG. 7, an embodiment of the bit line setup period according to progress of the program loop will be described.

In a program loop PLi (i is a natural number greater than 1), the potential of the bit line BL may increase to a reference voltage level Vref_i and increase at a slope s_i during a time tr_i. In a program loop PLk (k is a natural number greater than i), the potential of the bit line BL may increase to a reference voltage level Vref_k and increase at a slope s_k during a time tr_k.

As the program loop progresses, the reference voltage level may increase. As the program loop progresses, the slope of the increase of the potential of the bit line BL from the reference voltage level to the final voltage level may increase. As the program loop progresses, a period during which the increase from the reference voltage level to the final voltage level may be shortened. As the program loop progresses, the entire bit line setup time may be shortened.

In an embodiment, the reference voltage level of the first period may be determined based on the program loop count.

For example, the reference voltage level may be determined differently according to each program loop count. As the program loop count increases, the reference voltage level may increase. Alternatively, the reference voltage level may increase from a predetermined program loop count according to the program loop count. The word "predetermined" as used herein with respect to a parameter, such as a predetermined program loop count, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

As the program loop count increases, the reference voltage changes in constant or varying increments. In a first embodiment, as the program loop count increases, the reference voltage level may increase in constant or varying increments. In a second embodiment, as the program loop count increases, the reference voltage level may decrease in constant or varying increments. In a third embodiment, as the program loop count increases, the reference voltage level may increase at increments determined based on the program loop count. For example, as the program loop count increases, an increment of the reference voltage level may increase. Alternatively, as the program loop count increases, the increment of the reference voltage level may decrease.

In an embodiment, the potential of the bit line BL of the second period may increase at the slope determined based on the program loop count. As the program loop count increases, the slope may increase. Alternatively, as the program loop count increases, the slope may decrease.

In an embodiment, the second period may be determined based on the program loop count. As the program loop count increases, the second period may be shortened. Alternatively, as the program loop count increases, the second period may be longer.

In an embodiment, the final voltage level may be the program inhibition voltage level Vinh. In another embodiment, the final voltage level may be set differently according to the program loop count.

A bit line capacitance may be a capacitance generated by a coupling effect between adjacent bit lines. The bit line capacitance may increase as a potential difference between the adjacent bit lines increases. As the capacitance of the bit line increases, power for precharging the bit line may increase. The capacitance of the bit line may change as the program loop progresses. For example, at the first half of the program loop, the bit line to which the program permission voltage is applied and the bit line to which the program inhibition voltage is applied may be evenly mixed. At the second half of the program loop, the program inhibition voltage may be applied to most bit lines. Therefore, since the potential difference between the adjacent bit lines at the first half of the program loop is often larger than the potential difference at the second half of the program loop, the bit line capacitance may be large at the first half of the program loop.

According to an embodiment of the present disclosure, when the program loop count corresponds to a period in which the bit line capacitance is large, the potential of the bit line BL may be slowly increased from a low reference voltage level to the final voltage level at a low slope in order to prevent the peak current of the bit line. Since the peak current is not a problem when the program loop count corresponds to a period in which the bit line capacitance is small, the potential of the bit line BL may be quickly increased from a high reference voltage level to the final voltage level at a high slope in order to shorten a setup time of the bit line.

That is, the entire bit line setup time may be shortened and the peak current may be prevented, by adjusting the reference voltage level and a length (i.e., a duration in time) and a slope of a ramp period according to the program loop count, in consideration of the capacitance of the bit line.

In FIG. 7, as the program loop count increases, reference voltage level and the slope of the ramp period may increase and the length of the ramp period may be shortened. In another embodiment, as the program loop count increases, the reference voltage level and the slope of the ramp period may decrease and the length of the ramp period may increase.

A max loop count may be the maximum number of times of the program loop performed until the program operation is completed. A max loop count value may have a value predetermined at a manufacturing stage. Alternatively, the max loop count value may have a value measured at a use stage. The max loop count value may be updated in the use stage.

A progress degree of the program loop may be determined according to the max loop count and the program loop count. Even though the program loop count is the same, the progress degree of the program loop may be different according to the max loop count. In an embodiment, the progress degree may refer to the time that the program operation has progressed compared to the time required to complete the program operation. In an embodiment, the progress degree may refer to the number of loops in which the program operation is performed compared to the number of loops required to complete the program operation. In an embodiment, the progress degree may refer to the number of steps in which the program operation is performed compared to the number of steps required to complete the program operation.

Therefore, in various embodiments, by considering not only the program loop count but also the program loop progress degree, the reference voltage level and the length and the slope of the ramp period of each program loop may be set more appropriately.

For example, description will be given by comparing a case where the max loop count is 3 with a case where the max loop count is 6. When the max loop count is 3, the progress degree of the first program loop may be 1/3, the progress degree of the second program loop may be 2/3, and the progress degree of the third program loop may be 3/3. When the max loop count is 6, the progress degree of the first program loop may be 1/6, the progress degree of the second program loop may be 2/6, and the progress degree of the third program loop may be 3/6. In the second program loop, the program loop count is the same as 2 regardless of the max loop count, but the progress degree of the program loop may be different as 2/3 and 2/6 according to the max loop count. Therefore, in comparison with the case where the max loop count is 3, when the max loop count is 6, the progress degree of the program loop is low. Therefore, even with the same program loop count, the reference voltage level is relatively low, the length of the ramp period is long, and the slope is relatively gentle.

As described above, according to an embodiment of the present disclosure, the reference voltage level, and the length and the slope of the ramp period of each program loop may be set more accurately and precisely by considering not only the program loop count but also the program loop progress degree.

Figure 8:
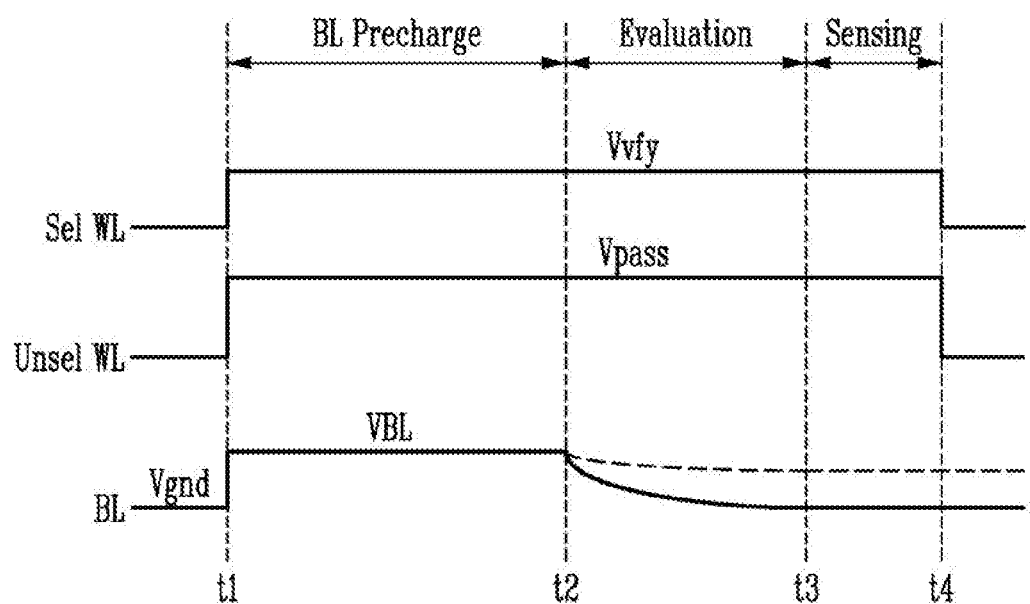
FIG. 8 is a diagram for describing a verify step of FIG. 4.

FIG. 8 is a diagram for describing the verify step of FIG. 4.

Referring to FIG. 8, the verify step of FIG. 4 may include a bit line precharge period BL precharge, an evaluation period Evaluation, and a sensing period Sensing.

T1 to T2 may be the bit line precharge period BL precharge. In the bit line precharge period BL precharge, a bit line precharge voltage may be applied to the bit line BL. The bit line BL may be precharged to a target voltage level VBL. The verify voltage Vvfy may be applied to the selected word line Sel WL and the pass voltage Vpass may be applied to the unselected word line Unsel WL.

T2 to T3 may be the evaluation period Evaluation. In the evaluation period Evaluation, the potential of the bit line BL may be discharged according to a result of comparison between the threshold voltage and the verify voltage Vvfy of the selected memory cells.

For example, a memory cell of which the threshold voltage is equal to or greater than the verify voltage Vvfy may be a cell programmed to a program state corresponding to the verify voltage Vvfy. In this case, the corresponding memory cell may be read as an off-cell. Since a current flowing through the bit line BL connected to the off-cell is small, a drop width of the potential of the bit line BL is small, and the potential of the bit line BL may be discharged as a dotted line during the evaluation period Evaluation.

A memory cell of which the threshold voltage is less than the verify voltage Vvfy may be a cell that is not programmed to the program state corresponding to the verify voltage Vvfy. In this case, the corresponding memory cell may be read as an on-cell. Since a current flowing through the bit line BL connected to the on-cell is large, the drop width of the potential of the bit line BL is large, and the potential of the bit line BL may be discharged as a solid line during the evaluation period Evaluation.

T3 to T4 may be the sensing period Sensing. In the sensing period Sensing, a sensing operation of verifying whether the selected memory cell is programmed to the target program state according to the potential of the discharged bit line BL may be performed.

In the sensing period Sensing, the voltage of the bit line BL corresponding to the dotted line and the voltage of the bit line BL corresponding to the solid line may be distinguished from each other by a sensing reference voltage Vtrip (not shown).

For example, when the potential of the bit line BL is greater than the sensing reference voltage, the memory cell connected to the bit line BL (dotted line) may be the off-cell and may be the cell programmed to the target program state. Therefore, the verification of the memory cell may be passed. When the potential of the bit line BL is less than the sensing reference voltage, the memory cell connected to the bit line BL (solid line) may be the on-cell and may be the cell that is not programmed to the target program state. Therefore, the verification of the memory cell may be failed.

FIG. 9A is a diagram for describing the bit line precharge period according to an embodiment.

Referring to FIG. 9A, an embodiment of the bit line precharge period BL precharge according to the progress of the program loop is described. The verify voltage Vvfy may be applied to the selected word line Sel WL during the bit line precharge period BL precharge every program loop. A level of the verify voltage Vvfy may be a threshold voltage corresponding to the target program state. In the program loop PLi (i is a natural number greater than 1), the potential of the bit line BL may increase to a target voltage level VBL_i. In the program loop PLk (k is a natural number greater than i), the potential of the bit line BL may increase to a target voltage level VBL_k.

As the program loop progresses, the target voltage level may increase. In the bit line precharge period BL precharge, the target voltage level VBL to which the bit line BL is precharged may be determined based on the program loop count.

The target voltage level VBL may increase as the program loop count increases. The target voltage level VBL may increase from a predetermined program loop count.

As the program loop count increases, the target voltage level VBL changes in constant or varying increments. In a first embodiment, the target voltage level VBL may increase in constant or varying increments as the program loop count increases. In a second embodiment, the target voltage level VBL may decrease in constant or varying increments as the program loop count increases. In a third embodiment, the target voltage level VBL may increase at increments determined based on the program loop count as the program loop count increases. For example, as the program loop count increases, an increment of the target voltage level VBL may increase. Alternatively, as the program loop count increases, the increment of the target voltage level VBL may decrease.

According to an embodiment of the present disclosure, current consumption due to the bit line precharge operation may be reduced, by setting the target voltage level to be low in the bit line precharge period BL Precharge in an initial program loop.

In various embodiments, the target voltage level VBL may be determined according to the max loop count. The max loop count may be the maximum number of times of the program loop performed until the program operation is completed. The max loop count value may have a value predetermined at a manufacturing stage. Alternatively, the max loop count value may have a value measured at a use stage. The max loop count value may be updated at the use stage.

The max loop count may be changed according to the number of data bits stored in one cell. As the number of data bits stored in one cell increases, an executed program loop also increases, and thus the max loop count may increase.

In an embodiment, the progress degree of the program loop may be determined according to the max loop count. The target voltage level of each program loop may be determined according to the progress degree of the program loop.

For example, description will be given under an assumption that the max loop count is 3 in an SLC program operation of storing one data bit in one cell. Since the SLC program operation is progressed during three program loops, the progress degree of the first program loop may be 1/3, the progress degree of the second program loop may be 2/3, and the progress degree of the third program loop may be 3/3.

Therefore, the target voltage level of the third program loop, which is the last program loop, may be the final target voltage level. The target voltage levels of the first and second program loops may be set to have a difference based on the final target voltage level.

Figure 9B:
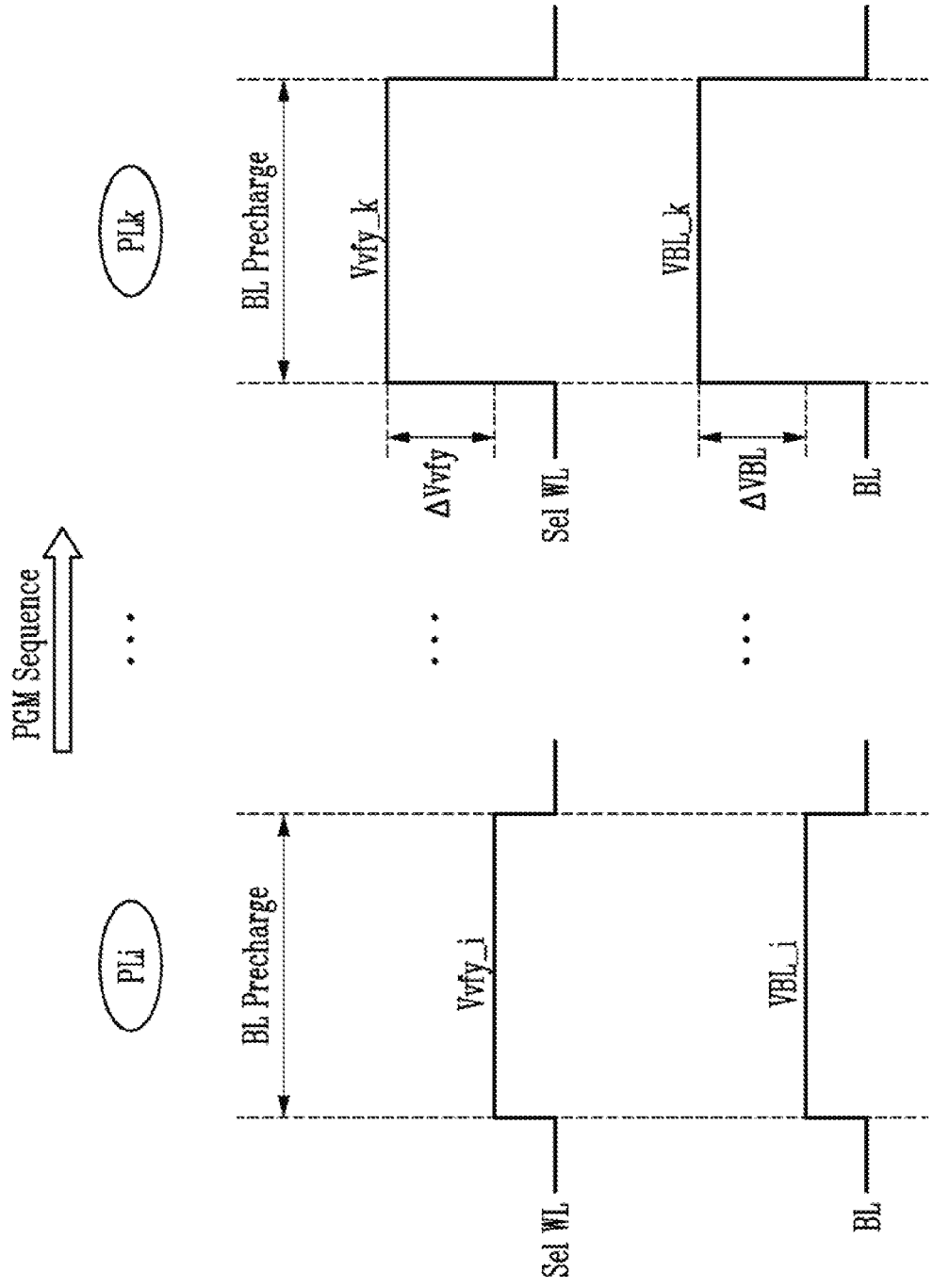
FIG. 9B is a diagram for describing the bit line precharge period according to another embodiment.

FIG. 9B is a diagram for describing the bit line precharge period according to another embodiment.

Referring to FIG. 9B, an embodiment of the bit line precharge period BL precharge according to the progress of the program loop is described.

In the program loop PLi (i is a natural number greater than 1), the potential of the bit line BL may increase to the target voltage level VBL_i. The potential of the selected word line Sel WL may increase to the verify voltage level Vvfy_i. In the program loop PLk (k is a natural number greater than i), the potential of the bit line BL may increase to the target voltage level VBL_k. The potential of the selected word line Sel WL may increase to the verify voltage level Vvfy_k As the program loop progresses, the target voltage level may increase. As the program loop progresses, the verify voltage level may increase.

In the bit line precharge period BL precharge, the target voltage level VBL to which the bit line BL is precharged may be determined based on the program loop count. As described with reference to FIG. 9A, the target voltage level VBL may be determined based on the max loop count.

The target voltage level VBL may increase as the program loop count increases. The target voltage level VBL may increase from a predetermined program loop count.

As the program loop count increases, the target voltage level VBL changes in constant or varying increments. In a first embodiment, the target voltage level VBL may increase in a constant or varying increments as the program loop count increases. In a second embodiment, the target voltage level VBL may decrease in constant or varying increments as the program loop count increases. In a third embodiment, the target voltage level VBL may increase at increments determined based on the program loop count as the program loop count increases. For example, as the program loop count increases, the increment of the target voltage level VBL may increase. Alternatively, as the program loop count increases, the increment of the target voltage level VBL may decrease.

In the bit line precharge period BL precharge, the verify voltage level Vvfy applied to the selected word line Sel WL may be determined based on the program loop count.

The verify voltage level Vvfy may increase as the program loop count increases. The verify voltage level Vvfy may increase from a predetermined program loop count.

As the program loop count increases, the verify voltage level Vvfy changes in constant or varying increments. In a first embodiment, the verify voltage level Vvfy may increase in constant or varying increments as the program loop count increases. In a second embodiment, the verify voltage level Vvfy may decrease in constant or varying increments as the program loop count increases. In a third embodiment, the verify voltage level Vvfy may increase at increments determined based on the program loop count as the program loop count increases. For example, as the program loop count increases, an increment of the verify voltage level Vvfy may increase. Alternatively, as the program loop count increases, the increment of the verify voltage level Vvfy may decrease.

In a first embodiment, an increase in an increment ΔVBL of the target voltage level and an increase in an increment ΔVvfy of the verify voltage level may be the same. In a second embodiment, the increase in an increment ΔVBL of the target voltage level and the increase in an increment ΔVvfy of the verify voltage level may be different from each other. In a third embodiment, the increase or decrease of the target voltage level VBL in constant or varying increments may be the same as the increase or decrease in constant or varying increments of the verify voltage level Vvfy as the program loop count increases. In a fourth embodiment, the increase or decrease of the target voltage level VBL in constant or varying increments may be different from the increase or decrease in constant or varying increments of the verify voltage level Vvfy as the program loop count increases.

According to an embodiment of the present disclosure, the current consumption due to the bit line precharge operation may be reduced by setting the target voltage level to be low in the bit line precharge period BL Precharge in the initial program loop. Program disturbance according to the increase of the target voltage level may be improved by also increasing the verify voltage level. As described above, the peak current may be reduced during the bit line precharge operation by differentially setting the target voltage level and the verify voltage level for each program loop count.

Figure 10:
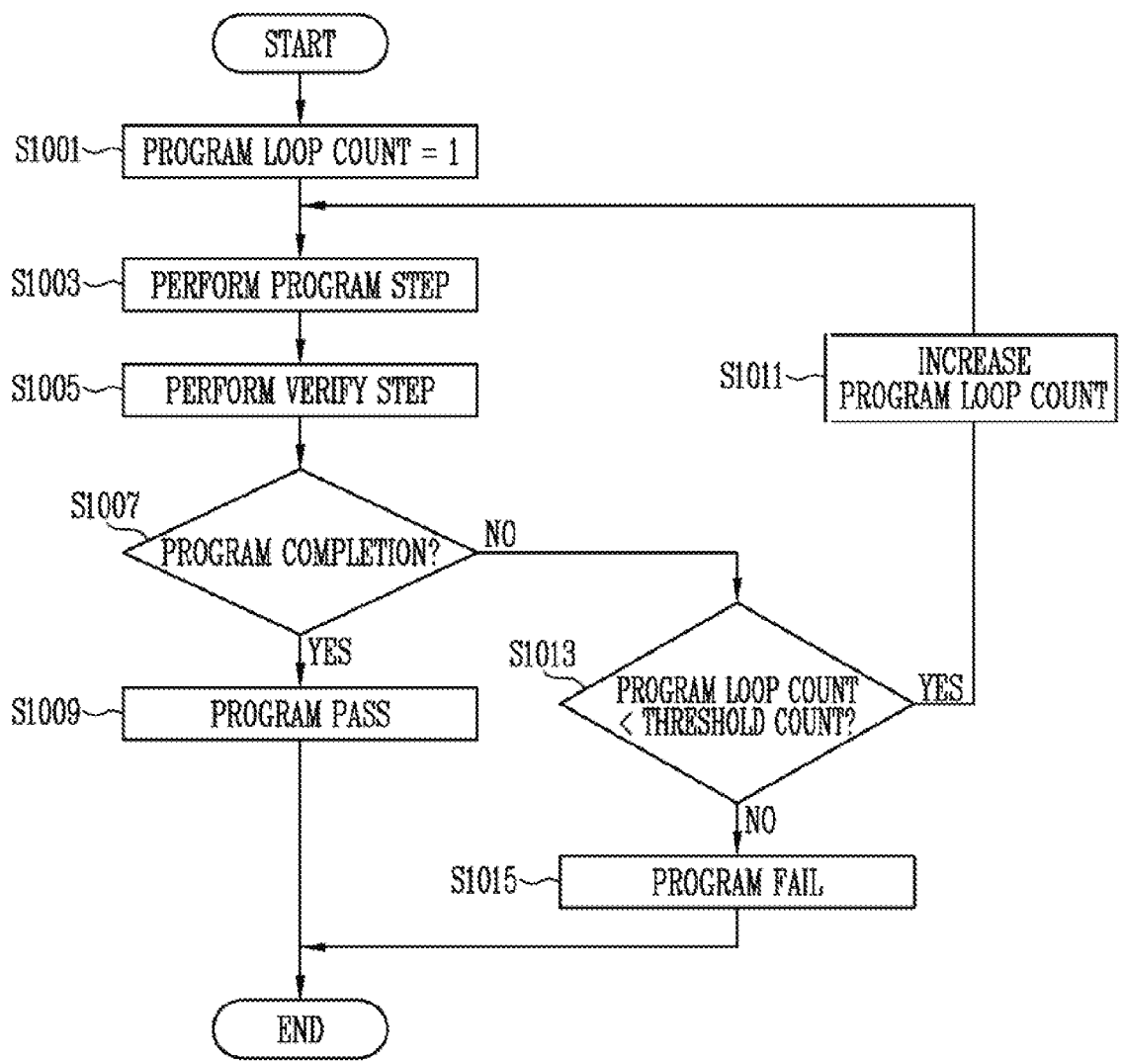
FIG. 10 is a flowchart for describing an operation of the memory device according to an embodiment.

FIG. 10 is a flowchart for describing an operation of the memory device according to an embodiment.

Referring to FIG. 10, in step S1001, the program loop count may be set to one.

In step S1003, the memory device may perform a program step. As described with reference to FIG. 5, the program step may include the bit line setup operation, the program voltage application operation, and the bit line discharge operation.

In step S1005, the memory device may perform the verify step. As described with reference to FIG. 8, the verify step may include the bit line precharge operation, the evaluation operation, and the sensing operation.

In step S1007, the memory device may determine whether the program is completed. As a result of the determination, when the program is completed, the process proceeds to step S1009, and when the program is not completed, the process proceeds to step S1013.

Specifically, the memory device may determine that the program is completed when all of the selected memory cells are programmed to the target program state as a result of performance of the verify step. The memory device may determine that the program is not completed when there is memory cell that is not programmed to the target program state among the selected memory cells as a result of the performance of the verify step.

In step S1009, the memory device may determine that the program operation is passed.

In step S1011, the program loop count may increase by one.

In step S1013, the memory device may determine whether the program loop count is less than a threshold count. As a result of the determination, the memory device proceeds to step S1011 when the program loop count is less than the threshold count, and proceeds to step S1015 when the program loop count is greater than or equal to the threshold count. In an embodiment, when a program loop count is less than a threshold count, the program loop count is increased and the steps are repeated again starting with S1003. The program loop count may be a number of times the program loop is performed during the program operation. The threshold count may be the maximum number of times a program loop that is set to determine the pass/fail of the program may be performed.

In step S1015, the memory device may determine that the program operation is failed. Since the program operation is failed, the memory device may again perform the program operation on another storage area according to a data recovery algorithm.

Figure 11:
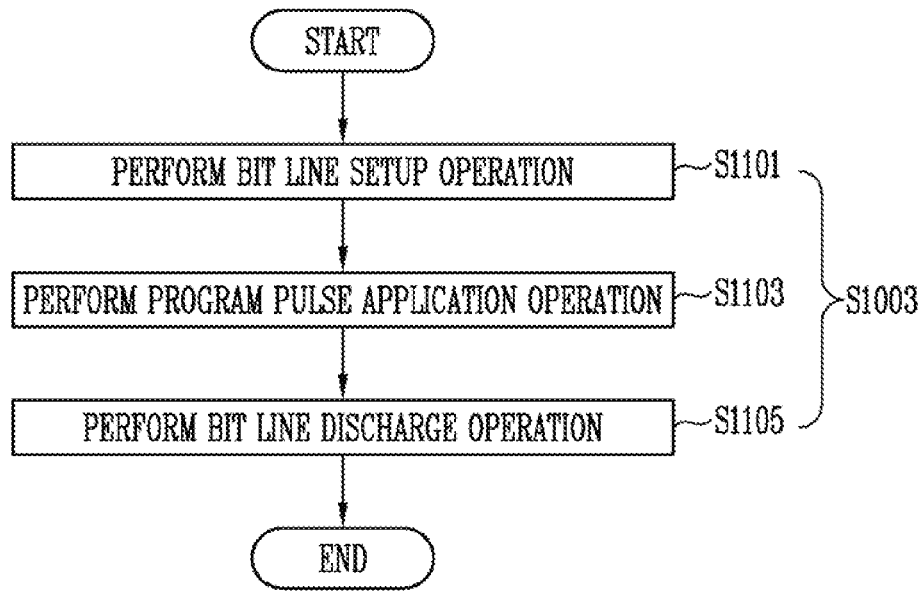
FIG. 11 is a flowchart for describing a program step of FIG. 10 in detail.

FIG. 11 is a flowchart for describing the program step S1003 of FIG. 10.

Referring to FIG. 11, in step S1101, the memory device may perform the bit line setup operation of setting up the potential of the bit line connected to the selected memory cells, according to data to be stored in the selected memory cells.

In step S1103, the memory device may perform the program pulse application operation of applying the program pulse to the selected memory cells to program the selected memory cells to the target program state.

In step S1105, the memory device may perform the bit line discharge operation of discharging the potentials of the word line and the bit line connected to the selected memory cells.

Figure 12:
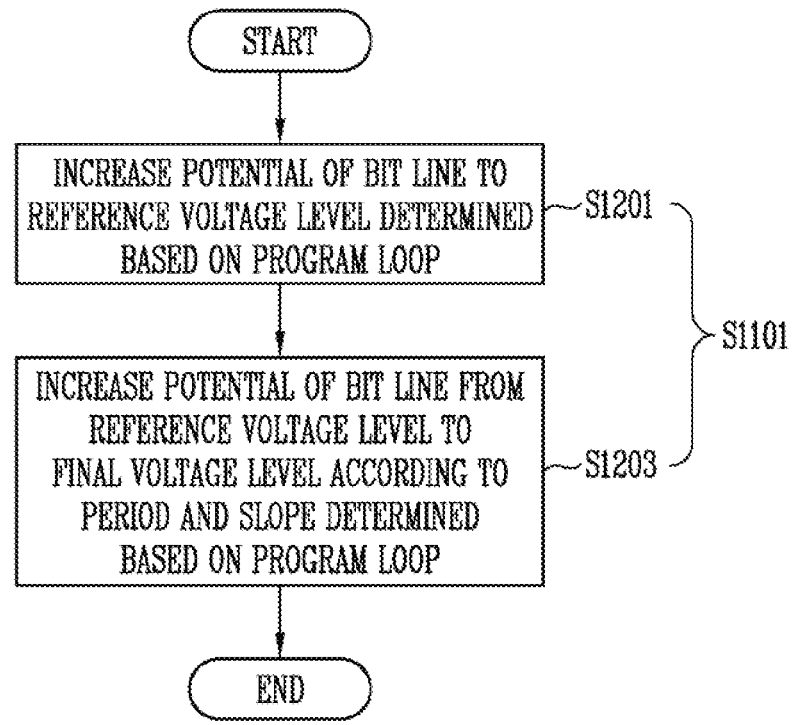
FIG. 12 is a flowchart for describing a bit line setup operation of FIG. 11 in detail.

FIG. 12 is a flowchart for describing the bit line setup operation of FIG. 11.

Referring to FIG. 12, in step S1201, the memory device may increase the potential of the bit line to the reference voltage level determined based on the program loop. The bit line may be a bit line connected to the program inhibition cell. The memory device may increase the potential of the bit line in a step signal form.

In an embodiment, as the program loop count increases, the increment of the reference voltage level may increase. The increase in the increment of the reference voltage level may be the same or different for each program loop count. In another embodiment, as the program loop count increases, the increment of the reference voltage level may decrease. A decrease in the increment of the reference voltage level may be the same or different for each program loop count.

In step S1203, the memory device may increase the potential of the bit line from the reference voltage level to the final voltage level according to the period and the slope determined based on the program loop. In an embodiment, the final voltage level may be the program inhibition voltage level. The memory device may increase the potential of the bit line in a ramp signal form.

In an embodiment, as the program loop count increases, the slope may increase. An increment of the slope may be the same or different for each program loop count. As the program loop count increases, an increase period of the bit line potential may be shortened. A decrement of the increase period may be the same or different for each program loop count.

In another embodiment, as the program loop count increases, the slope may decrease. A decrement of the slope may be the same or different for each program loop count. As the program loop count increases, an increase period of the bit line potential may be longer. An increment of the increase period may be the same or different for each program loop count.

In various embodiments, the reference voltage level, the slope, and the length of the increase period may be determined based on the program loop progress degree in addition to the program loop count. The program loop progress degree may be determined based on the program loop count and the max loop count. The max loop count may be the maximum number of times of the program loop performed until the program operation is completed.

Figure 13:
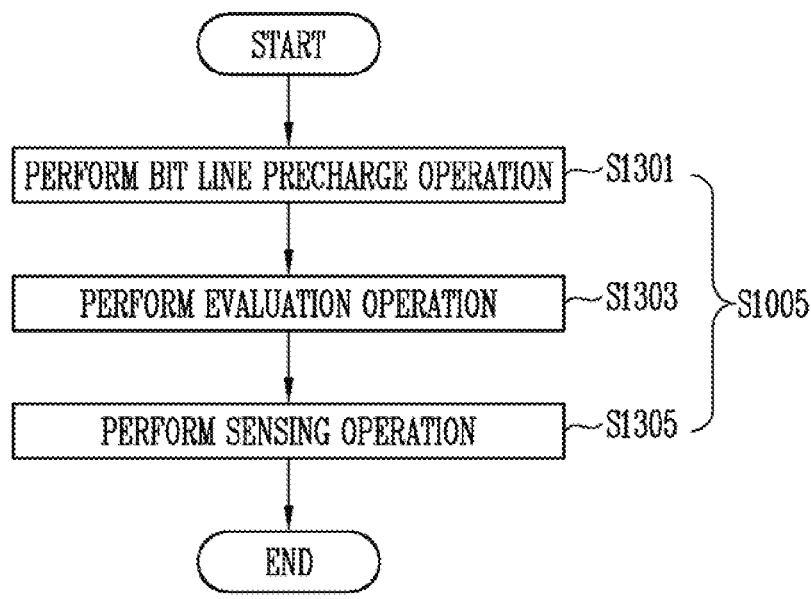
FIG. 13 is a flowchart for describing a verify step of FIG. 10 in detail.

FIG. 13 is a flowchart for describing the verify step S1005 of FIG. 10.

Referring to FIG. 13, in step S1301, the memory device may perform the bit line precharge operation of precharging the bit line to verify the program state of the selected memory cells.

In step S1303, when the bit line precharge operation is completed, the memory device may perform the evaluation operation of discharging the potential of the bit line according to a result of comparison between the threshold voltage with the verify voltage of the selected memory cell.

In step S1305, the memory device may perform the sensing operation of sensing the data stored in the selected memory cell according to the potential of the discharged bit line.

Figure 14:
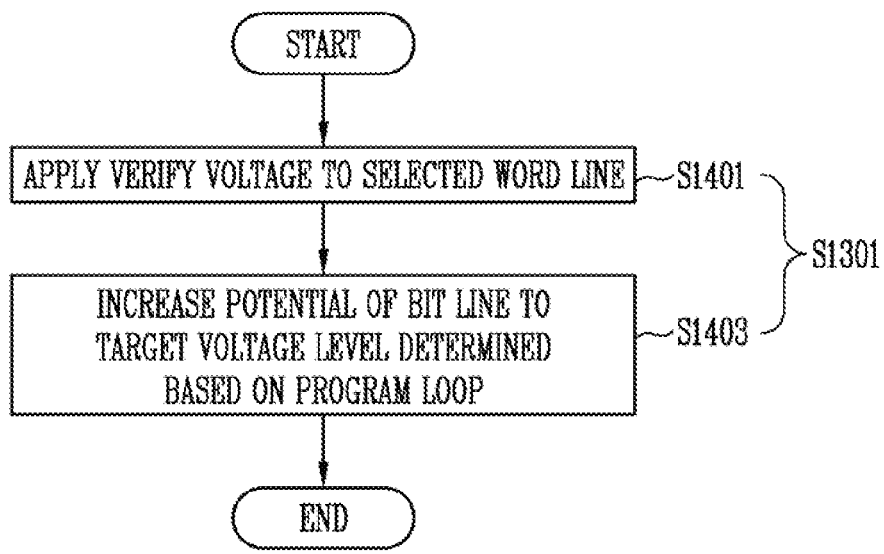
FIG. 14 is a flowchart for describing a bit line precharge operation of FIG. 13 in detail.

FIG. 14 is a flowchart for describing the bit line precharge operation of FIG. 13.

Referring to FIG. 14, in step S1401, the memory device may apply the verify voltage to the selected word line. The verify voltage level may be a threshold voltage corresponding to the target program state. The verify voltage level may be determined based on the program loop.

In an embodiment, the verify voltage level during the program loop may be constant regardless of the program loop count. In another embodiment, as the program loop count increases, the verify voltage level may increase. An increment of the verify voltage level may be the same or different for each program loop count. In another embodiment, as the program loop count increases, the verify voltage level may decrease. A decrement of the verify voltage level may be the same or different for program loop count.

In step S1403, the memory device may increase the potential of the bit line to the target voltage level determined based on the program loop.

In an embodiment, as the program loop count increases, the increment of the target voltage level may increase. An increase in the increment of the target voltage level may be the same or different for each program loop count. In another embodiment, as the program loop count increases, the increment of the target voltage level may decrease. A decrease in the increment of the target voltage level may be the same or different for each program loop count.

In an embodiment, the increase in an increment of the target voltage level and the increase in an increment of the verify voltage level may be the same as or different from each other. In another embodiment, the decrease in an increment of the target voltage level and the decrease in an increment of the verify voltage level may be the same as or different from each other.

In various embodiments, the target voltage level may be determined based on the program loop progress degree in addition to the program loop count. The program loop progress degree may be determined based on the program loop count and the max loop count. The max loop count may be the maximum number of times of the program loop performed until the program operation is completed.

Figure 15:
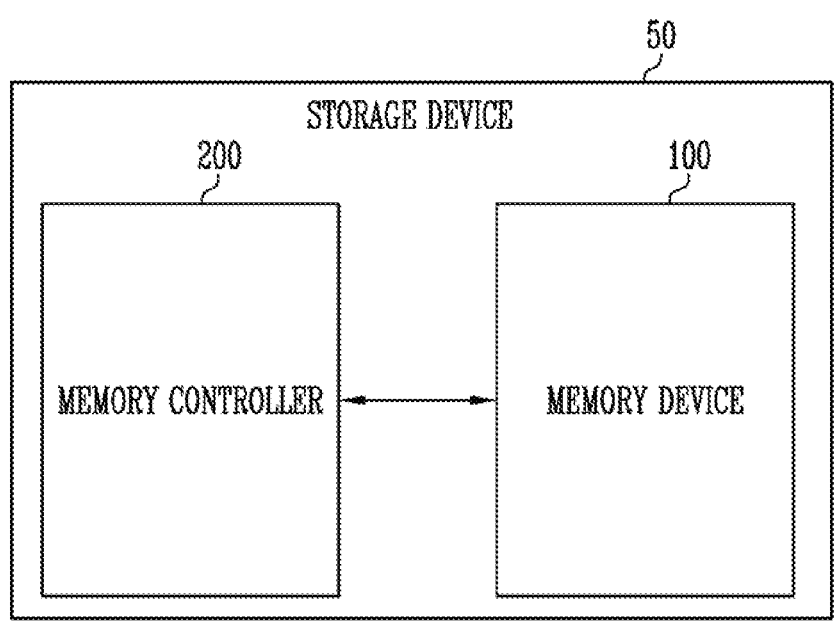
FIG. 15 is a diagram for describing a storage device including the memory device of FIG. 1.

FIG. 15 is a diagram for describing a storage device including the memory devices of FIG. 1.

Referring to FIG. 15, the storage device 50 may include the memory device 100 and a memory controller 200 controlling an operation of the memory device 100. The storage device 50 is a device that stores data under control of a host such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. That is, the memory device 100 may perform an operation instructed by the command on the area selected by the address.

For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the logical block address (LBA) into a physical block address (PBA) indicating an address of memory cells included in the memory device 100 in which data is to be stored.

The memory controller 200 may control the memory device 100 to perform the program operation, the read operation, or the erase operation in response to a request from the host. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host. For example, the memory controller 200 may provide a command, an address, and data to the memory device 100 so as to perform background operations such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

The host may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

What is claimed is:

1. A memory device comprising:
   a plurality of memory cells;
   a peripheral circuit configured to perform a plurality of program loops each including a program operation and a verify operation on selected memory cells of the plurality of memory cells; and
   control logic configured to control the peripheral circuit to increase a potential of selected bit lines among bit lines connected to the selected memory cells to a reference voltage level during a first period and increase the potential of the selected bit lines to a final voltage level during a second period, in the program operation,
   the reference voltage level is determined differently according to a program loop count indicating the number of program loops that have been successively performed.

2. The memory device of claim 1, wherein the reference voltage level increases as the program loop count increases.

3. The memory device of claim 2, wherein the reference voltage level increases at constant increments.

4. The memory device of claim 2, wherein the reference voltage level increases at different increments according to the program loop count.

5. The memory device of claim 1, wherein the potential of the selected bit lines increases at a slope determined based on the program loop count during the second period.

6. The memory device of claim 5, wherein the slope increases as the program loop count increases.

7. The memory device of claim 5, wherein a duration of the second period is determined based on the program loop count.

8. The memory device of claim 7, wherein the duration of the second period is shortened as the program loop count increases.

9. The memory device of claim 5, wherein the control logic determines the reference voltage level, a duration of the second period, and the slope according to a program loop progress degree, and
   the program loop progress degree is determined based on the program loop count and a max loop count, which is a maximum number of times of a program loop performed until completion of the program operation.

10. The memory device of claim 9, wherein the max loop count includes at least one of a value predetermined at a manufacturing stage and a value measured at a use stage.

11. The memory device of claim 1, wherein the selected bit lines are bit lines connected to program inhibition cells among the selected memory cells, and
the final voltage level is a program inhibition voltage level.

12. The memory device of claim 1, wherein the control logic controls the peripheral circuit to apply a program voltage to a word line connected to the selected memory cells when the potential of the selected bit lines increases to the final voltage level in the program operation.

13. A memory device comprising:
a plurality of memory cells;
a peripheral circuit configured to perform a plurality of program loops each including a program operation and a verify operation on selected memory cells of the plurality of memory cells; and
control logic configured to control the peripheral circuit to increase a potential of the bit lines connected to the selected memory cells to a target voltage level, in the verify operation,
wherein the target voltage level is determined differently according to a program loop count indicating the number of program loops that have been successively performed.

14. The memory device of claim 13, wherein the target voltage level increases as the program loop count increases.

15. The memory device of claim 14, wherein the target voltage level increases at constant increments.

16. The memory device of claim 14, wherein the target voltage level increases at different increments according to the program loop count.

17. The memory device of claim 13, wherein the control logic determines the target voltage level according to a program loop progress degree, and
the program loop progress degree is determined based on the program loop count and a max loop count, which is a maximum number of times of a program loop performed until completion of the program operation.

18. The memory device of claim 17, wherein the max loop count includes at least one of a value predetermined at a manufacturing stage and a value measured at a use stage.

19. The memory device of claim 13, wherein the control logic controls the peripheral circuit to apply a verify voltage determined based on the program loop to a word line connected to the selected memory cells, in the verify operation.

20. The memory device of claim 19, wherein a level of the verify voltage increases as the program loop count increases.

21. The memory device of claim 19, wherein a level of the verify voltage is constant in the plurality of program loops.

22. A method of operating a memory device that performs a plurality of program loops each including a program step and a verify step for selected memory cells of a plurality of memory cells,
wherein the program step comprises:
increasing a potential of selected bit lines among bit lines connected to the selected memory cells to a reference voltage level; and
increasing the potential of the selected bit lines from the reference voltage level to a final voltage level, and
wherein the reference voltage level is determined differently according to a program loop count indicating the number of program loops that have been successively performed.

23. The method of claim 22, wherein the reference voltage level increases as the program loop count increases.

24. The method of claim 22, wherein increasing to the final voltage level comprises increasing the potential of the selected bit lines at a slope determined based on the program loop count during a duration of a set period.

25. The method of claim 24, wherein the slope increases as the program loop count increases.

26. The method of claim 24, wherein the duration of the set period is shortened as the program loop count increases.

27. The method of claim 22, wherein the program step further includes applying a program voltage to a word line connected to the selected memory cells.

28. A method of operating a memory device that performs a plurality of program loops each including a program step and a verify step for selected memory cells of a plurality of memory cells,
wherein the verify step comprises:
applying a verify voltage to a word line connected to the selected memory cells; and
increasing a potential of bit lines connected to the selected memory cells to a target voltage level, and
wherein the target voltage level is determined differently according to a program loop count indicating the number of program loops that have been successively performed.

29. The method of claim 28, wherein the target voltage level increases as the program loop count increases.

30. The method of claim 29, wherein the target voltage level increases at constant increments.

31. The method of claim 29, wherein the target voltage level increases at different increments according to the program loop count.

32. The method of claim 28, wherein a level of the verify voltage increases as the program loop count increases.

33. The method of claim 28, wherein a level of the verify voltage is constant in the plurality of program loops.

* * * * *